United States Patent

Chiou et al.

Patent Number: 6,060,401
Date of Patent: May 9, 2000

[54] METHOD OF FABRICATING DUAL CYLINDRICAL CAPACITOR

[75] Inventors: Jung-Chao Chiou, Hsinchu; King-Lung Wu, Tainan Hsien, both of Taiwan

[73] Assignee: United Microelectronics Corp., Hsinchu, Taiwan

[21] Appl. No.: 09/178,273

[22] Filed: Oct. 23, 1998

[30] Foreign Application Priority Data

Aug. 4, 1998 [TW] Taiwan ................................. 87112802

[51] Int. Cl.$^7$ .................................................. H01L 21/00
[52] U.S. Cl. ........................ 438/733; 438/719; 438/740; 438/753
[58] Field of Search ..................... 438/241, 256, 438/399, 719, 733–735, 740, 753

[56] References Cited

U.S. PATENT DOCUMENTS 5,668,038  9/1997  Huang et al. ................... 438/719 X
5,849,624  12/1998  Fazan et al. ..................... 438/753 X Primary Examiner—William Powell

[57] ABSTRACT

A method of fabricating a dual cylindrical capacitor. On a substrate having a conductive region, an insulation layer is formed with an opening which exposes the conductive region. A conductive layer is formed over the insulation layer to fill the expose conductive region. A mask is formed to cover a part of the conductive layer aligned over the perimeter of the opening. A part of the conductive layer is removed to form two protrusions on the surface of the remaining conductive layer aligned over the perimeter of the opening. A spacer is formed on each side wall of the protrusions. Using each spacer as a mask, the remaining conductive layer is further removed by self-stop etching process. The spacer is removed, and a dielectric layer is formed to cover the conductive layer. Another conductive layer is formed to cover the dielectric layer.

8 Claims, 4 Drawing Sheets

METHOD OF FABRICATING DUAL CYLINDRICAL CAPACITOR

CROSS-REFERENCE TO RELATED APPLICATION

This application claims the priority benefit of Taiwan application Ser. No. 87112802, filed Aug. 4, 1998, the full disclosure of which is incorporated herein by reference.

BACKGROUND OF THE INVENTION

1. Field of the Invention

The invention relates in general to a method of fabricating a capacitor, and more particularly, to a method of fabricating a dual cylindrical capacitor in a dynamic random access memory (DRAM).

2. Description of the Related Art

As the functions of microprocessor become more and more versatile, the program and the calculation run by a software becomes more and more sizeable. The storing capacitance of a memory is required to be larger and larger. FIG. 1 shows a circuit diagram of a memory cell in a DRAM device. A memory cell typically comprises a transfer transistor 10 and a storing capacitor 11. The source of the transistor 10 is connected to the corresponding bit line 12, where the gate is connected to the word line 13, and the drain is connected to the storing electrode 14, that is, the bottom electrode, of the capacitor 11. The plate electrode 15, also called the top electrode or the cell plate, of the capacitor 11 is connected to a power supply. The capacitor 11 further comprises a dielectric layer 16 between the bottom electrode 14 and the top electrode 15.

The capacitor plays as a heart of a DRAM, the more charges the capacitor can store, the less it is affected by noise, for example, soft error caused by an α particle, while accessing data. Furthermore, the frequency of refresh can be reduced. Currently, methods to increase capacitance of the capacitors are (1) to increase the dielectric constant of the dielectric layer, so that the charge stored in a unit area is increased; (2) to reduce the thickness of the dielectric layer; and (3) to increase the surface area of the capacitor.

Conventionally, a two dimensional capacitor, that is, a planar type capacitor, is used in a DRAM to increase the capacitance. The planar capacitor occupies a large surface area of the device. Therefore, in a device with high integration, this kind of capacitor can not be applied. A three dimensional capacitor, such as a stacked type, a trench type, or a cylinder type capacitor, is then developed to overcome the drawback of the planar type capacitor.

A single cylindrical capacitor has been developed for the purpose of increasing capacitance. However, as the device with a higher integration demands a further higher capacitance, to design a capacitor with increasing capacitance in the limited space without complicating the fabricating process becomes a trend in semiconductor manufacture and the relative field.

SUMMARY OF THE INVENTION

It is an object of the invention to provide a method of fabricating a capacitor. The capacitor comprises a dual cylindrical bottom electrode, so that the capacitance is increased by the increase of surface area. Moreover, the dual cylindrical capacitor is formed in a same space required as a single cylindrical capacitor and by a technique as simple as a conventional method. Thus, the capacitor is formed with an improved quality with the same fabrication cost and time.

To achieve the above-mentioned objects and advantages, a method of fabricating a dual cylindrical capacitor is provided. On a substrate having a conductive region, an insulation layer is formed with an opening which exposes the conductive region. A conductive layer is formed over the insulation layer to fill the expose conductive region. A mask is formed to cover a part of the conductive layer aligned over the perimeter of the opening. A part of the conductive layer is removed to form two protrusions on the surface of the remaining conductive layer aligned over the perimeter of the opening. A spacer is formed on each side wall of the protrusions. Using each spacer as a mask, the remaining conductive layer is further removed by self-stop etching process. The spacer is removed, and a dielectric layer is formed to cover the conductive layer. Another conductive layer is formed to cover the dielectric layer.

Both the foregoing general description and the following detailed description are exemplary and explanatory only and are not restrictive of the invention, as claimed.

DESCRIPTION OF THE PREFERRED EMBODIMENTS

Figure 1:
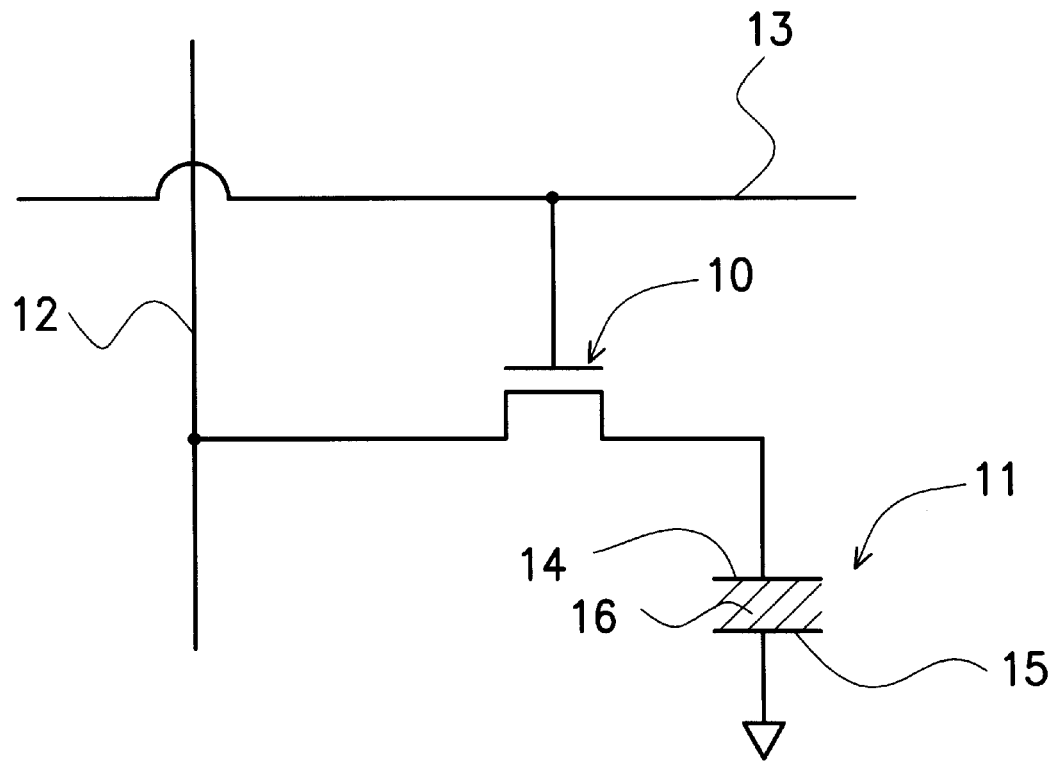
FIG. 1 shows a circuit diagram of a memory cell in a conventional DRAM.
Figure 2A:
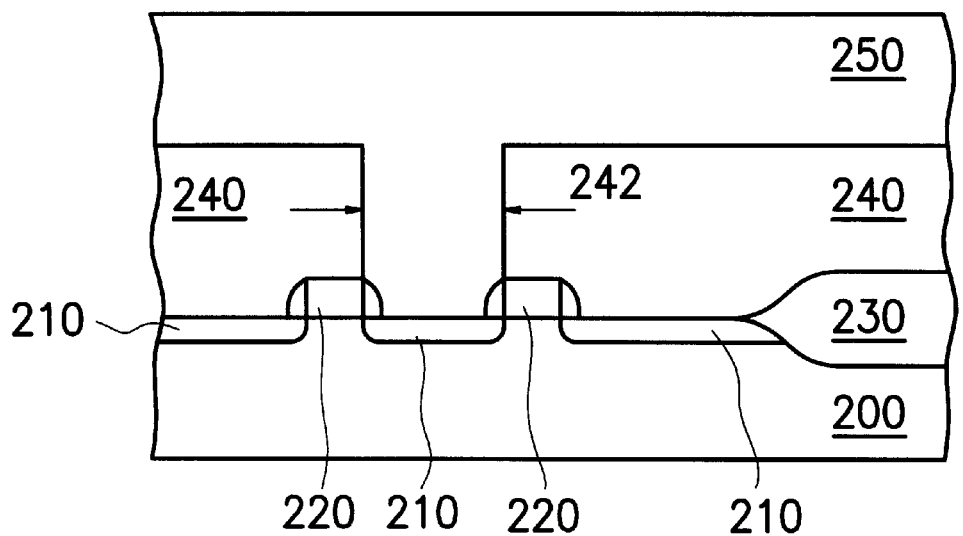
FIG. 2A, 2B, 2C, 2D, 2E and 2F shows a method of forming a bottom electrode of a capacitor in a DRAM in a preferred embodiment according to the invention.
Figure 2B:
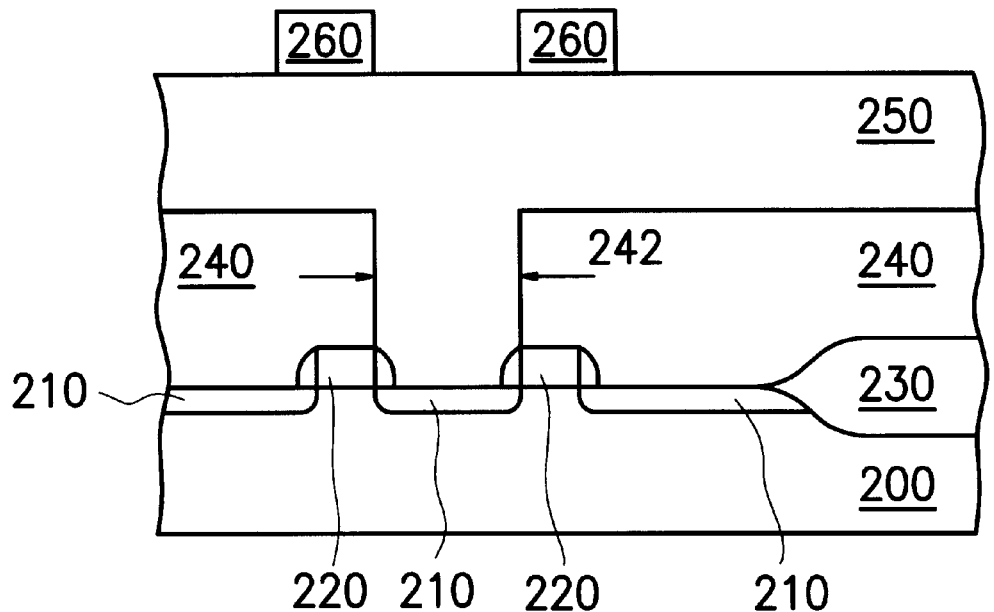

FIG. 2A to FIG. 2B show a preferred embodiment of fabricating a bottom electrode of a capacitor in a DRAM cell, it is appreciated that persons skilled in the art can apply this technique in fabricating a capacitor on a device other than a transistor or a DRAM. In FIG. 2A. a semiconductor substrate 200 comprising a transistor having a source/drain region 210 and a gate 220, a field oxide layer 230 and an insulation layer is provided. The field oxide layer 230 can also be replaced by other insulation structure such as a shallow trench isolation, whereas the insulation layer 240 can be formed by an oxide layer. By the deposition of a photo-resist layer, exposure and development, and etching process, a contact window 242 within the insulation layer 240 is form to expose the source/drain region 210. A conductive layer 250, preferably a doped polysilicon layer formed by a chemical vapor deposition with a thickness of about 10 kÅ, is formed on the insulation layer 240 to fill the contact window 242. The conductive layer 250 is thus coupled with the source/drain region 210.

In FIG. 2B, a photo-resist layer 260 is formed on the conductive layer 250. Through the steps of exposure and development, preferably, by deep ultra-violet light, the photo-resist layer 260 is defined to cover the part of the conductive layer aligned over a perimeter of the contact window 242 only. Typically, the photo-resist layer 260 is defined like a ring which encompasses the contact window 242 while one observes from the top. From the cross sectional view shown as FIG. 2B, the photo-resist layer 260 remains above the edges of the contact window 242.

Figure 2C:
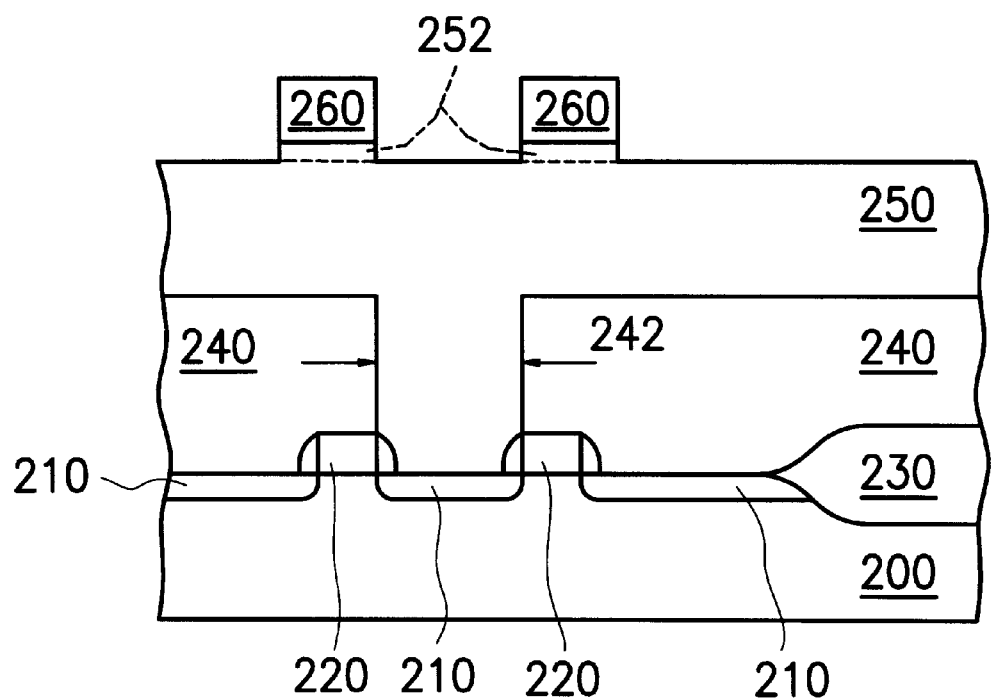

In FIG. 2C, using anisotropic etching, a part of the conductive layer 250 is removed with the photo-resist layer 260 as a mask. A protrusion 252 conformal to the photo-resist layer 260 of the conductive layer 250 is formed. In this example, the protrusion 252 has a ring shape.

Figure 2D:
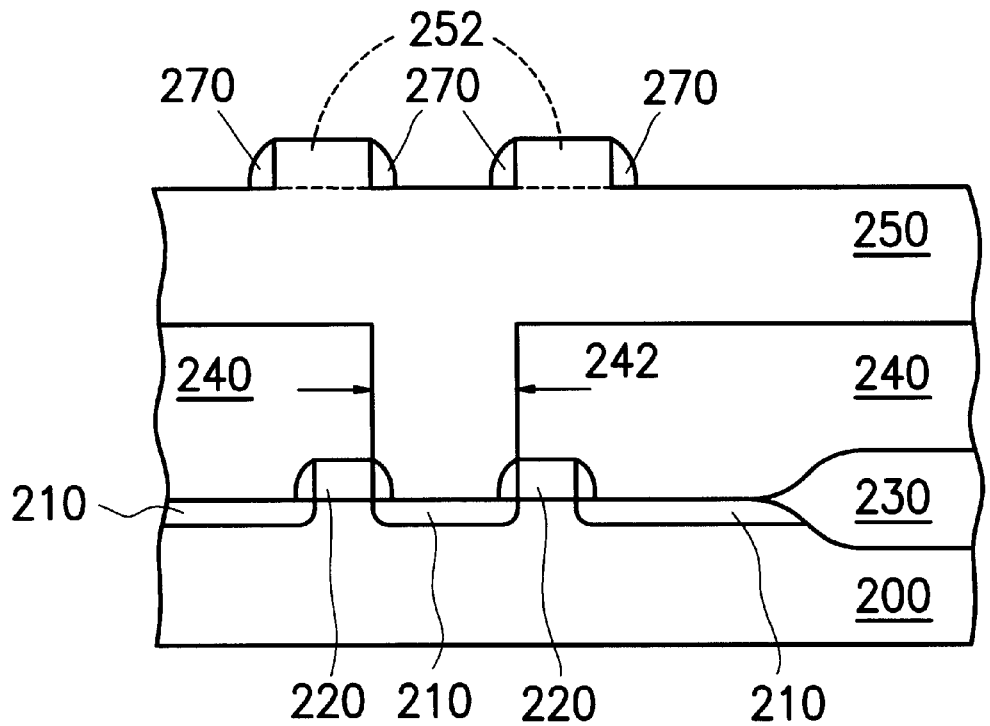

In FIG. 2D, the photo-resist layer 260 is removed. A spacer 270 is formed to cover an outer side wall and an inner side wall of the protrusion 252. The material of the spacer 270 can be selected from silicon oxide formed by atmosphere pressure chemical vapor deposition (APCVD) using tetra-ethyl-ortho-silicate (TEOS) as gas source, though other material can also be used.

Figure 2E:
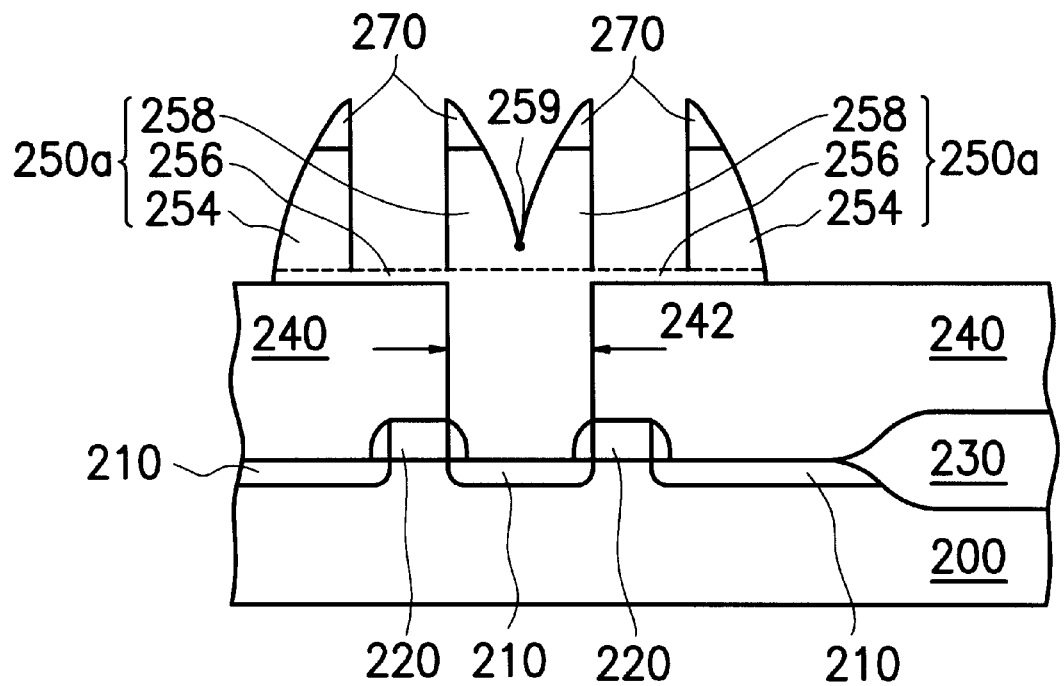

In FIG. 2E, using the spacer 270 as a mask, the conductive layer 250 with the protrusion 252 is etched anisotropically. The conductive layer 250 encompassed by the protrusion 252 is etched along the spacer 270 to a certain point 259. That is, when the inner side wall 258 of the protrusion 252 merges at this etch stop point 259 with an aspect ratio that the conductive layer 250 cannot be removed any further, the etch process is self stopped. A dual cylindrical bottom electrode 250a is thus formed from the resultant conductive layer which comprises a base portion 256, the inner side wall 258 and the outer side wall 254.

Figure 2F:
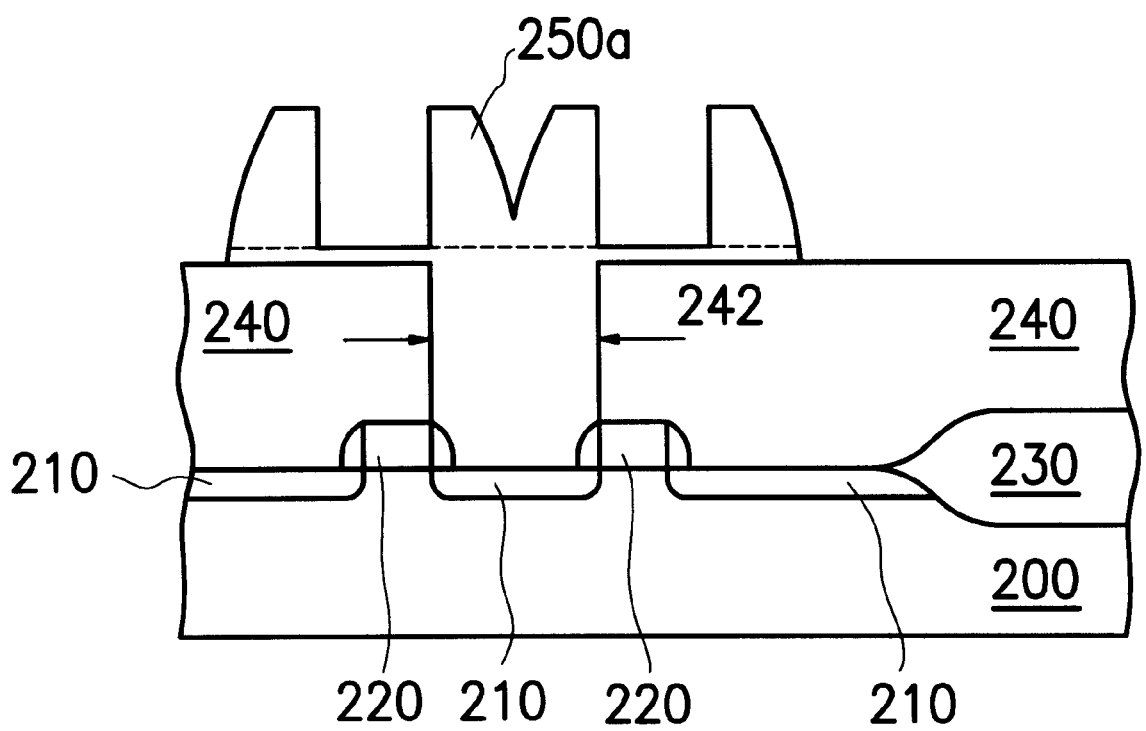

In FIG. 2F, the photo-resist layer 270 is removed. A dielectric layer (not shown) is formed to cover the bottom electrode layer 250a, and another conductive layer (not shown) is formed to cover the dielectric layer to form a capacitor.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming a dual cylindrical capacitor on a semiconductor substrate having at least a device isolation structure and a transistor, wherein the transistor includes at least a gate and a source/drain region, the method comprising:

forming a first insulation layer on the substrate;

forming a contact window penetrating through the first insulation layer to expose the source/drain region;

forming a first conductive layer on the first insulation layer to fill the contact window and to couple with the source/drain region;

removing a part of the first conductive layer to form a protrusion aligned over a perimeter of the contact window;

forming a second insulation layer to cover an inner side wall and an outer side wall of the protrusion;

etching the first conductive layer with the second insulation layer as a mask, the first conductive layer encompassed by the protrusion being etched along the inner side wall of the protrusion and self stopped while the inner side wall merge at a point;

removing the second insulation layer;

forming a dielectric layer to cover the first conductive layer; and forming a second conductive layer on the dielectric layer.

2. The method according to claim 1, wherein the first conductive layer includes a doped polysilicon layer.

3. The method according to claim 1, wherein the first conductive layer has a thickness of about 1 kÅ.

4. The method according to claim 1, wherein the step of etching the first conductive layer with the insulation layer as a mask comprises an anisotropic etching process.

5. A method of forming a bottom electrode of a capacitor on a conductive region of a substrate, comprising:

forming an insulation layer on the substrate, the insulation layer having an opening exposing the conductive region;

forming a conductive layer to cover the insulation layer and to fill the conductive region;

removing a part of the conductive layer to form a ring shape protrusion aligned over an edge of the opening;

forming a spacer on each of an inner side wall and an outer side wall of the ring shape protrusion;

etching the protrusion and the conductive layer to form a dual cylindrical bottom electrode; and removing the spacer.

6. The method according to claim 5, wherein the conductive layer comprises a doped polysilicon layer.

7. The method according to claim 5 wherein the conductive layer has a thickness of about 1 kÅ.

8. The method according to claim 5, the conductive layer and the protrusion are etched along the inner side wall and the outer side wall and stopped when the inner side wall merge at a point.

* * * * *